United States Patent
Isebo et al.

(10) Patent No.: US 8,012,287 B2
(45) Date of Patent: Sep. 6, 2011

(54) VIA HOLE FORMING METHOD USING ELECTROPHOTOGRAPHIC PRINTING METHOD

(75) Inventors: Kazuhiro Isebo, Moriyama (JP); Norio Sakai, Moriyama (JP); Kenji Kawakami, Nanjyo (JP); Nobuaki Ogawa, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 60 days.

(21) Appl. No.: 12/559,589

(22) Filed: Sep. 15, 2009

(65) Prior Publication Data

US 2009/0320986 A1    Dec. 31, 2009

Related U.S. Application Data

(63) Continuation of application No. PCT/JP2008/052291, filed on Feb. 13, 2008.

(30) Foreign Application Priority Data

Mar. 22, 2007  (JP) ................................. 2007-075160

(51) Int. Cl.
*B32B 15/00* (2006.01)
(52) U.S. Cl. ........ 156/230; 156/235; 156/240; 156/247; 156/249; 427/458; 430/120.2
(58) Field of Classification Search .......................... None
See application file for complete search history.

(56) References Cited

U.S. PATENT DOCUMENTS

| 5,457,881 | A  | * | 10/1995 | Schmidt ........................... 29/852 |
| 5,737,833 | A  | * | 4/1998  | Motomura et al. .............. 29/830 |
| 5,865,934 | A  |   | 2/1999  | Yamamoto et al. |
| 6,729,022 | B2 | * | 5/2004  | Kurita et al. ..................... 29/846 |
| 6,884,313 | B2 | * | 4/2005  | Liu et al. ........................ 156/292 |
| 7,001,662 | B2 | * | 2/2006  | Sugaya et al. ................. 428/344 |
| 7,560,215 | B2 | * | 7/2009  | Sharma et al. .............. 430/117.4 |
| 2004/0197487 | A1 |   | 10/2004 | Aoki et al. |

FOREIGN PATENT DOCUMENTS

| JP | 04-177793 A | 6/1992 |
| JP | 06-085457 A | 3/1994 |

(Continued)

OTHER PUBLICATIONS

Official Communication issued in International Patent Application No. PCT/JP2008/052291, mailed on Mar. 18, 2008.

(Continued)

*Primary Examiner* — Kimberly K McClelland
(74) *Attorney, Agent, or Firm* — Keating & Bennett, LLP

(57) ABSTRACT

A via hole forming method and a multilayered board manufacturing method improve manufacturing yield by reducing the required processes. The via hole forming method includes a first step of forming a toner image by attaching toner particles, containing a conductive material and having a protruding portion, onto the surface of a first photosensitive member so that the protruding portion is directed to the outside; and a second step of opposing the surface of the first photosensitive member to one principal surface of a green sheet containing an insulating material and transferring the toner image to the one principal surface of the green sheet so that the protruding portions of the toner particles protrude into the green sheet so as to reach the other principal surface of the green sheet and the toner particles are buried in the green sheet. The via holes are formed using an electrophotographic printing method.

8 Claims, 5 Drawing Sheets

FOREIGN PATENT DOCUMENTS

| | | |
|---|---|---|
| JP | 7-74466 A | 3/1995 |
| JP | 11-298118 A | 10/1999 |
| JP | 2003-347731 A | 12/2003 |
| JP | 2004-047816 A | 2/2004 |
| JP | 2004-048030 A | 2/2004 |

OTHER PUBLICATIONS

Official Communication issued in corresponding Japanese Patent Application No. 2009-505099, mailed on Jun. 21, 2011.

* cited by examiner

VIA HOLE FORMING METHOD USING ELECTROPHOTOGRAPHIC PRINTING METHOD

FIELD OF THE INVENTION

The present invention relates to a via hole forming method using an electrophotographic printing method, and more particularly, to a via hole forming method of forming a via hole disposed inside a substrate or the like using an electrophotographic printing method.

DESCRIPTION OF THE RELATED ART

A ceramic multilayered board is formed by plastically deforming a laminated structure obtained by stacking and pressing plural green sheets as needed. In the green sheets, circuit patterns such as resistor patterns as resistive elements, wirings as inductors, or electrodes of capacitors are formed on the surface thereof or a conductor is filled in through holes to form via holes. The via holes are formed by performing a punching process on the green sheet by mechanical punching using a mold or laser application and then filling the holes with conductor using a screen printing method or the like (see, for example, Japanese Unexamined Patent Application Publication No. 6-85457).

When the via holes are formed in this way, different processes such as a punching process and a conductor filling process are required. Accordingly, since the manufacturing processes increase and defects occur in the processes, it is difficult to further improve the yield, thereby limiting the reduction of manufacturing cost.

SUMMARY OF THE INVENTION

In view of the above, preferred embodiments of the present invention provide a via hole forming method that is capable of improving manufacturing yield by reducing the required processes.

According to a preferred embodiment of the present invention, a via hole forming method using an electrophotographic printing method includes: (1) a first step of forming a toner image by attaching toner particles, containing a conductive material and having a protruding portion, onto the surface of a first photosensitive member so that the protruding portion is directed to the outside; and (2) a second step of opposing the surface of the first photosensitive member to one principal surface of a green sheet containing an insulating material and transferring the toner image to the one principal surface of the green sheet so that the protruding portions of the toner particles protrude into the green sheet so as to reach the other principal surface of the green sheet and the toner particles are buried in the green sheet.

In the second step of the via hole forming method, the toner particles buried in the green sheet are exposed from both principal surfaces of the green sheet. The via holes can be formed by the toner particles buried in the green sheet.

In the via hole forming method, it is preferable that the respective toner particles have a planar portion and the tip of the protruding portion is directed to the normal direction of the planar portion.

In this case, in the first step, since the protruding portions of the toner particles are directed to the outside by attaching the planar portions of the toner particles to the surface of the first photosensitive member, it is possible to match the directions of the toner particles to be parallel or substantially parallel to each other at the time of attaching the toner particles to the photosensitive member.

It is preferable that the most of the respective toner particles are formed of a single metal lump.

In this case, since the toner particles contain metal lumps manufactured by plating or machining, the resistance value is lowered and the electrical characteristic is improved.

It is preferable that the toner particles are formed by coupling a plurality of particles of a conductive material.

In this case, since charged resin can be applied to the toner particles, the application area of the charged resin increases and thus the attachment force for attaching the toner particles to the photosensitive member can be enhanced. Accordingly, it is possible to reduce the defects due to the detachment of the toner particles from the photosensitive member or the like.

Preferably, the via hole forming method may further include: (3) a third step of forming a second toner image by attaching second toner particles containing a second conductive material to the surface of a second photosensitive member; and (4) a fourth step of transferring the second toner image to the green sheet and transferring and fixing the second toner particles to the green sheet.

In this case, since the formation of the via holes and the formation of the interconnection electrodes or the like can be continuously carried out using the same type of apparatus, it is possible to accomplish the reduction of the manufacturing time and the simplification of the processes. The third and fourth steps may be performed after the first and second steps, or the third and fourth steps may be performed before the first and second steps, or the first and second steps and the third and fourth steps may be simultaneously performed in parallel. The second conductive material may be the same as the first conductive material. The second photosensitive member may be the same as the first photosensitive member. The second toner image may be formed on the other principal surface of the green sheet.

According to another preferred embodiment of the present invention, in a multilayered board manufacturing method, a laminated structure is manufactured by laminating a plurality of green sheets in which the via holes are formed by the above-mentioned via hole forming method using the electrophotographic printing method.

In this case, by solidifying the laminated structure by a plastic deformation or the like, it is possible to efficiently manufacture a multilayered board.

In the circuit pattern forming method according to the preferred embodiments of the invention, since the punching process and the conductor filling process can be simultaneously performed by transferring the toner particles, it is possible to reduce the processes and thus to improve the yield.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Hereinafter, examples as preferred embodiments of the invention will be described with reference to FIGS. 1 to 6.

Example 1

Example 1 will be described with reference to FIGS. 1 to 3C.

Figure 1:
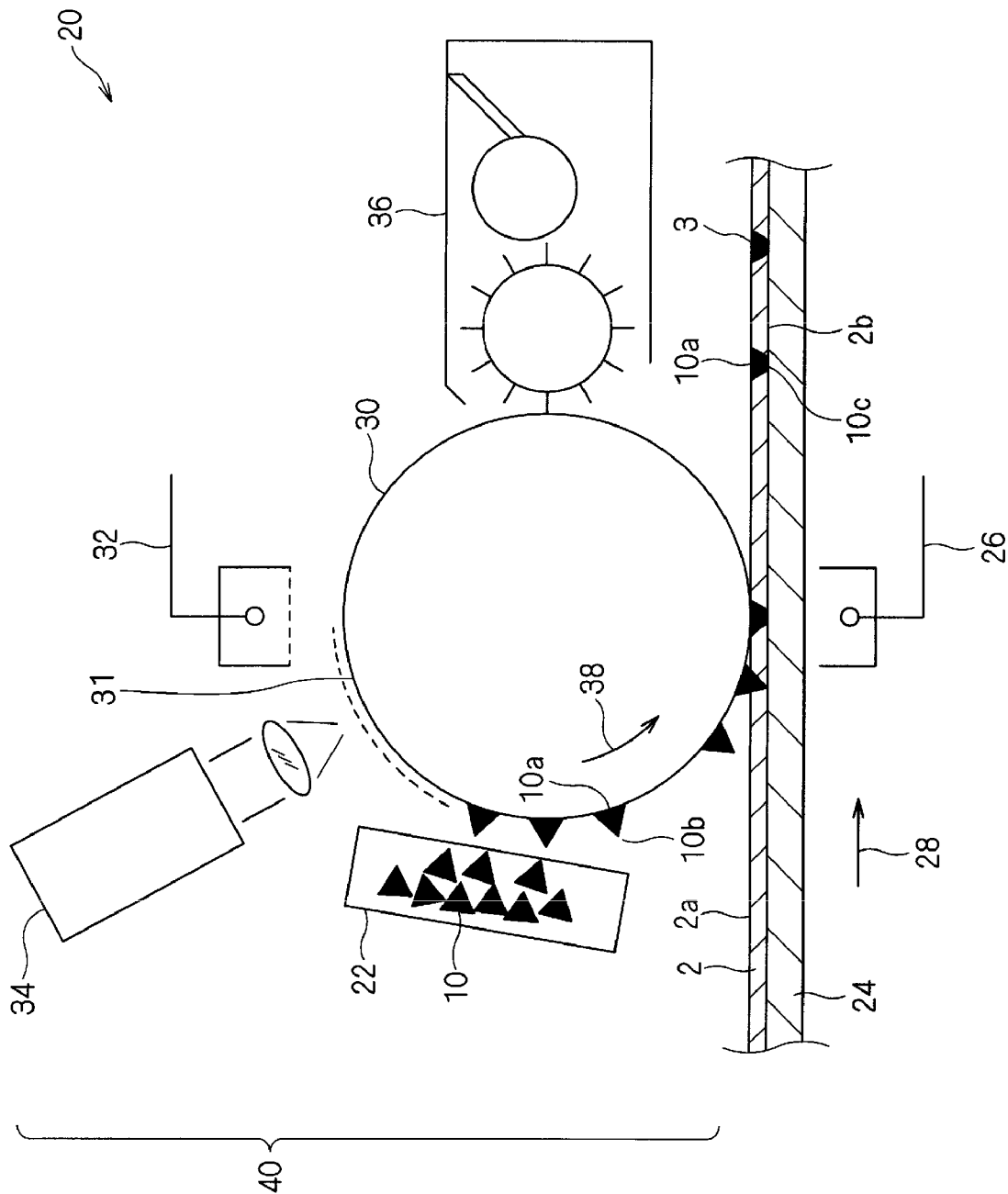
FIG. 1 is a diagram illustrating the configuration of an electrophotographic printer (Example 1).

As schematically shown in FIG. 1, via holes 3 are formed by burying toner particles 10 in a plastically-non-deformed ceramic green sheet 2 containing a ceramic material using an electrophotographic device 20 for forming toner particles and transferring and fixing the toner particles.

The electrophotographic device 20 includes a developing unit 40 and a transfer unit 26.

In the developing unit 40, a charger 32, an exposure device 34, a toner supply device 22, and a cleaner 36 are disposed around a photosensitive member 30 preferably having a drum shape. The charger 32 electrically charges the surface 31 of the photosensitive member 30. For example, a corona charger is preferably used as the charger 32. The exposure device 34 applies light to the surface 31 of the photosensitive member 30 and forms a desired latent image pattern (not shown). The toner supply device 22 supplies toner particles 10 containing a conductive material onto the latent image pattern of the photosensitive member 30 to develop a toner image. The cleaner 36 cleans the surface 31 of the photosensitive member 30 onto which the toner image has been transferred.

The transfer unit 26 transfers the toner particles 10 formed on the surface 31 of the photosensitive member 30 onto a ceramic green sheet 2 as a printing matter. The transfer device 26 is disposed below the photosensitive member 30. The surface 31 of the photosensitive member 30 comes in contact with the top surface 2a of the ceramic green sheet 2 supported on the carrier film 24.

The operation of the electrophotographic device 20 will be described now.

First, the surface of the photosensitive member 30 is uniformly charged to a predetermined potential (for example, negative charges) by the charger 32, while rotating the photosensitive member 30 in the direction indicated by arrow 38. An example of the specific charging method includes a scorotron charging method, a roller charging method, and a brush charging method.

Subsequently, by applying the light to the surface 31 of the photosensitive member 30 in accordance with an image signal corresponding to a via hole pattern by the use of the exposure device 34, the negative charges of the applied area are removed and an image of the charges (electrostatic latent image) corresponding to the via hole pattern is formed on the surface of the photosensitive member 30. The applied light is generated from a laser oscillator, an LED, or other suitable device, for example.

Figure 3A:
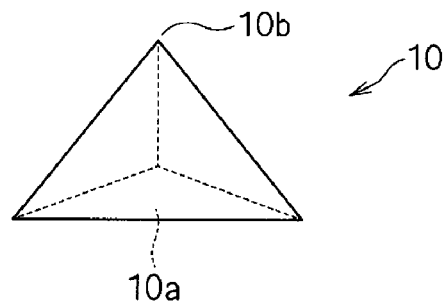
FIGS. 3A-3C are perspective views of a toner particle (Example 1).

Then, the toner particles 10 are electrostatically attached to the electrostatic latent image on the photosensitive member 30 by the use of the toner supply device 22 to form a visible image (toner image). The toner particles 10 preferably have a gimlet shape or a needle shape. For example, as shown in FIG. 3A, each toner particle preferably has a substantially regular tetrahedral shape and includes a planar portion 10a and a protruding portion 10b. As shown in FIG. 1, the planar portion 10a is attached to the surface 31 of the photosensitive member so that the tip of the protruding portion 10b is directed to the outside.

Subsequently, the ceramic green sheet 2 charged to the plus potential is carried in the direction of the arrow 28 in synchronization with the rotation of the photosensitive member 30 while getting close to or coming in contact with the surface 31 of the photosensitive member 30, and the toner image on the surface 31 of the photosensitive member 30 is transferred to the surface 5 of the ceramic green sheet 2 by the transfer unit 26.

At this time, in the toner particles 10 attached to the surface 31 of the photosensitive member 30 to form the toner image, the tips of the protruding portions 10b are thrust into the surface 2a of the ceramic green sheet 2 supported by the carrier film 24 with the rotation of the photosensitive member 30, pass through the ceramic green sheet 2, and reach the bottom surface 2b of the ceramic green sheet 2, whereby the tips 10c pressed and flattened by the carrier film 24 are formed. In this way, the via holes 3 are formed by burying the toner particles 10 in the ceramic green sheet 2.

The toner particles 10 are buried in the ceramic green sheet 2 by applying a pressure to the ceramic green sheet 2 with the photosensitive member 30. In this case, the applied pressure depends on the size or the number of toner particles 10 and the thickness of the ceramic green sheet 2 in which the toner particles 10 are buried, but for example, when 10,000 toner particles are buried in a ceramic green sheet of 150 mm×150 mm, a surface pressure of about 100 MPa to about 1000 MPa, for example, is sufficient.

It is preferable that the ceramic green sheet is heated to the temperature of about 40° C. to about 100° C., for example, to soften the binder of the ceramic green sheet.

It is also preferable that the thickness of the ceramic green sheet is smaller than the thickness of the carrier film and the thickness of the carrier film preferably is about 0.05 mm or more, for example.

Only the ceramic green sheet may be mounted on a stage or a belt and may be carried without using the carrier film.

Since the toner image can be transferred by relatively moving the ceramic green sheet 2 and the photosensitive member 30, the ceramic green sheet 2 may be fixed and the developing unit 40 and the transfer unit 26 may be moved, so that the surface of the photosensitive member 30 moves while rotating along the top surface 2a of the ceramic green sheet 2.

Figure 2:
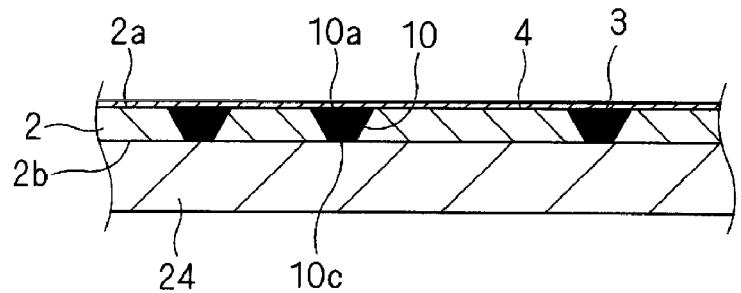
FIG. 2 is an enlarged sectional view illustrating a portion of a green sheet (Example 1).

In the ceramic green sheet 2 to which the toner image is transferred, as shown in the partially enlarged view of FIG. 2, a circuit pattern 4 is formed on the surface 2a by a printing method or the like using a conductive paste as needed, and then a predetermined number of sheets are laminated and pressed. By plastically deforming the laminated structure manufactured in this way, it is possible to obtain a ceramic multilayered board.

Figure 3B:
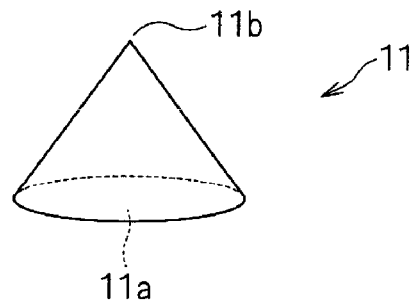
Figure 3C:
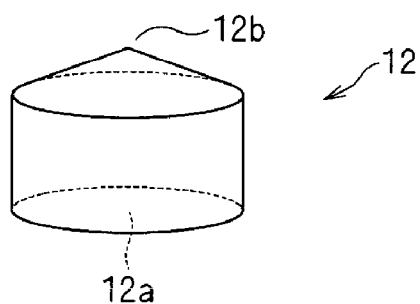

As shown in the perspective views of FIGS. 3A-3C, the surface of the conductive material preferably formed in a gimlet shape or a needle shape in the toner particles is coated with a resin. The representative example of the conductive material includes Au, Ag, Cu, Ni, Pd, and W. The conductive material is shaped in a metal lump by (a) a shaping method of allowing melted metal to flow in a mold, (b) a shaping method of machining metal, (c) a shaping method of forging metal, or (d) a shaping method of depositing plated metal to a mold. The greater portion of the respective toner particles is preferably formed of one metal lump.

As shown in FIGS. 3A to 3C, the toner particles 10 to 12 have planar portions 10a to 12a and protruding portions 10b to 12b of which the tips are directed to the normal directions of the planar portions 10a to 12a, respectively. When the planar portions 10a to 12a are attached to the surface of the photosensitive member 30, the tips of the protruding portions 10b to 12b are directed to the outside and thus it is easy to match the directions of the toner particles 10 to 12 in parallel at the time of attacking the toner particles to the photosensitive member 30. Toner particles having a three-dimensional shape other than that described above may be used.

In the toner particles 10 having a substantially regular tetrahedral shape shown in FIG. 3A, the tips of the protruding portions are directed to the outside even when a surface is attached to the surface 31 of the photosensitive member 30. Accordingly, it is easy to match the directions in parallel when the toner particles 10 are attached.

The toner particles 11 having a substantially conic shape shown in FIG. 3B can be easily formed by mounting a mask having circular or substantially circular through holes on a base, filling the through holes with paste having a proper viscosity including a conductive material, and then pulling up the mask from the base to stretch the paste upward.

The toner particles 11 in which the tip of a cylindrical shape is substantially conic shown in FIG. 3C can be easily formed by mounting two sheets of masks having circular or substantially circular through holes disposed concentrically on a base, filling the through holes with paste having a proper viscosity and including a conductive material, and pulling up only the upper mask from the base to stretch the paste of the tip upward. When the toner particles are buried in the ceramic green sheet, the sectional shape perpendicular or substantially perpendicular to the axis is substantially constant and the resistance values of the via holes are substantially constant at any sectional position.

When the via holes are formed using the electrophotographic printing method as described above, the toner particles including a conductive material are directly buried in the ceramic green sheet and thus holes for the via holes need not be formed in advance in the ceramic green sheet. Accordingly, it is possible to reduce the processes and thus to reduce the manufacturing cost.

To form a toner image on the photosensitive member, it is easy to position the toner image with high precision and the positional precision of the via holes is excellent. Accordingly, it is possible to reduce the size of a product.

The sharp tips of the toner particles are thrust in the green sheet and are buried in the ceramic green sheet. Accordingly, when the ceramic green sheet is carried in the post processes, the toner particles are not moved. Therefore, it is possible to prevent defects such as electrical short-circuit due to the conductive waste material coming off from the toner particles or the electrical disconnection due to the coming-off of the toner particles.

Since the circuit pattern can be formed to reliably overlap with the via holes after the toner particles are buried in the ceramic green sheet, the connection of the circuit pattern to the via holes is stabilized and the reliability of the connection is improved.

When the toner particles are buried in the ceramic green sheet in the state where the ceramic green sheet is placed on the carrier film, the tips of the toner particles come in contact with the carrier film formed of PET or PEN harder than the ceramic green sheet and thus are flattened and the flattened tips of the toner particles are not coated with the ceramic green sheet again. Accordingly, when the layers are interconnected with the flattened tips of the via holes, the connection is stabilized and thus the yield is improved.

When the greater portion of each toner particle is formed of a single metal lump, the resistance value of the circuit is lowered and the loss in the high-frequency circuit can be reduced, thereby accomplishing excellent characteristics.

When the metal lump constituting the greater portion of each toner particle is formed by plating, it is possible to form the toner particles easily and inexpensively and thus to reduce the manufacturing cost. Since the shaping mold can be manufactured with high precision, it is possible to form minute protruding portions with high precision. In electric plating, the density of the metal lump can be controlled by controlling the current value. Accordingly, a void can be formed in the metal lump and thus the contraction amounts of the ceramic green sheet and the via holes are matched at the time of plastically deforming the laminated structure, thereby preventing defects due to cracks around the via holes resulting from the difference in contraction amount between the two at the time of plastically deforming the laminated structure.

Example 2

Example 2 will be described with reference to FIGS. 4A-4C. In Example 2, only the configuration of the toner particles buried in the ceramic green sheet is different from that of Example 1.

Figure 4A:
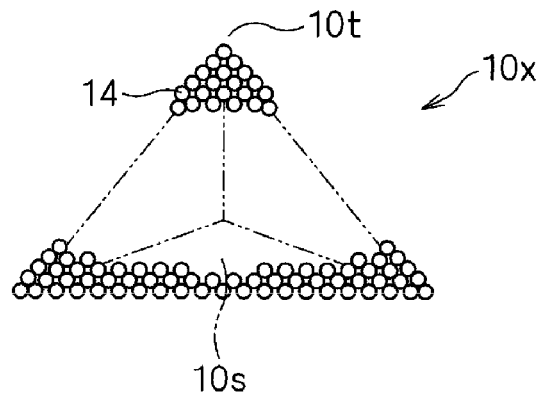
FIGS. 4A-4C are perspective views of a toner particle (Example 2).
Figure 4B:
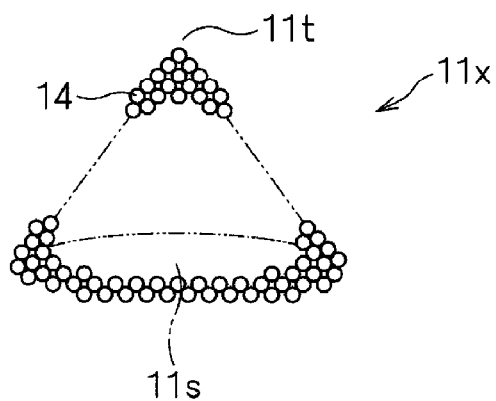
Figure 4C:
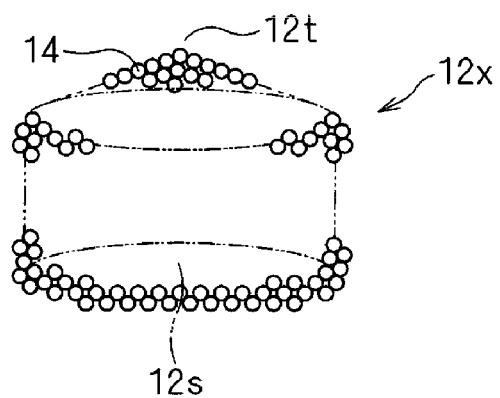

As shown in the perspective views of FIGS. 4A to 4C, the toner particles 10x to 12x preferably have a gimlet-shaped or needle-shaped structure formed by coupling plural particles 14 of a conductive material. Similarly to Example 1, the toner particles 10x to 12x have planar portions 10s to 12s and protruding portions 10t to 12t of which the tips are directed to the normal direction of the planar portions 10s to 12s. When the planar portions 10s to 12s are attached to the surface of the photosensitive member 30, the tips of the protruding portions 10t to 12t are directed to the outside and thus it is easy to match the directions of the toner particles 10x to 12x in parallel at the time of attaching the toner particles to the photosensitive member 30. Toner particles which are sets of conductive material particles and which have a three-dimensional shape other than that described above may be used.

Single metal particles of Au, Ag, Cu, Ni, Pd, or W or composite metal particles thereof are preferably used as the conductive material particles 14 and a paste of additive particles of the common basis metal or the like with varnish is used as needed, and these are shaped in the shape shown in FIGS. 4A-4C by a mask. The toner particles 10x to 12x are charged by (a) a method using the conductive material particles of metal to be pasted, which have been previously coated with charged resin, (b) a method using varnish, which is coated with charged resin, for pasting, or (c) a method of coating the shaped particles with the charged resin.

When the toner particles 10x to 12x, which are sets of the conductive material particles 14, are used, the charged resin can be applied to the conductive material particles 14. Accordingly, the application area of the charged resin increases and thus the toner particles 10x to 12x can be satisfactorily charged. Accordingly, it is possible to reduce the defects due to the loss of the toner particles 10x to 12x from the photosensitive member 30.

The conductive material is granular. Accordingly, when the conductive material is plastically deformed with the ceramic green sheet, the wetting area of the glass component increases and the diffusion into the ceramic sheet is good. Therefore, the high bonding property of the conductive material and the ceramic sheet can be obtained, thereby improving the characteristics of the ceramic multilayered board. In addition, by adding inorganic materials such as glass constituting the ceramic green sheet to the toner particles 10x to 12x, the ceramic green sheet and the toner particles 10x to 12x can be matched in contraction behavior. Accordingly, it is possible to prevent defects due to cracks around the via holes resulting from the difference in the contraction amount between the two at the time of plastic deformation and to improve the bonding strength of the via holes and the ceramic board.

Example 3

Example 3 will be described with reference to the schematic diagram of FIGS. 5A and 5B.

In Example 3, unlike Example 1, the developing of the toner image and the burial of the toner particles are performed on independent stages using a panel-shaped photosensitive member 30x.

Figure 5A:
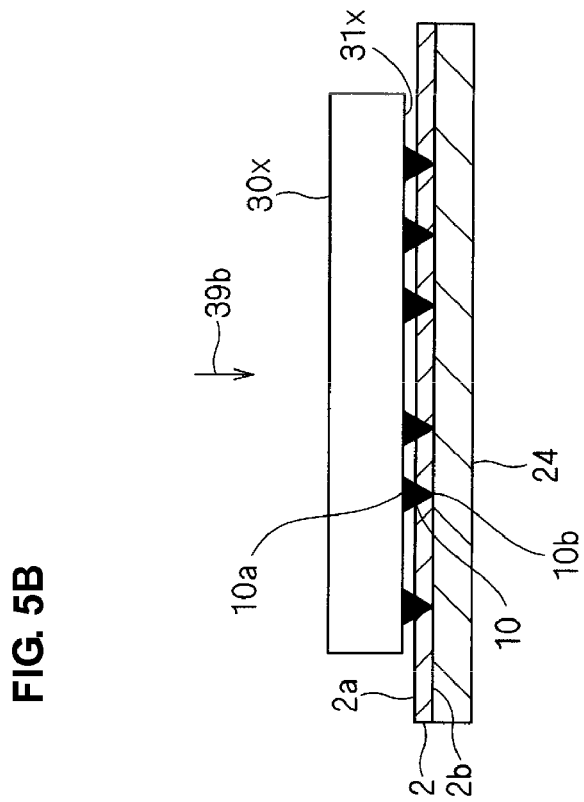
FIGS. 5A and 5B are diagrams illustrating an electrophotographic printer (Example 3).

That is, as indicated by the arrow 39a in FIG. 5A, the toner image is formed by bringing the photosensitive member 30x close to the toner supply device 22x and attaching the planar portions 10a of the toner particles 10 to the latent image formed in advance on the bottom surface 31x of the photosensitive member 30x.

Figure 5B:
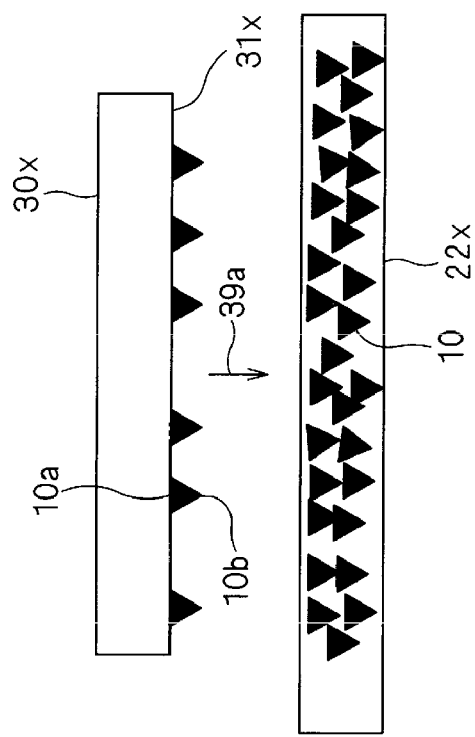

As indicated by the arrow 39b in FIG. 5B, the photosensitive member 30x in which the toner image is developed is brought close to the ceramic green sheet 2 supported on the carrier film 24, the tips of the protruding portions 10b of the toner particles 10 attached to the bottom surface 31x of the photosensitive member 30x are thrust in the top surface 2a of the ceramic green sheet 2, the photosensitive member 30x is moved to the ceramic green sheet 2 from the state shown, the tips of the protruding portions 10b of the toner particles 10 are brought into contact with the carrier film 24, and the tips of the protruding portions 10b are pressed and flattened.

By using the panel-shaped photosensitive member 30x, a pressure can be applied vertically to the ceramic green sheet 2 in the state where the tips of the protruding portions 10b of the toner particles 10 are directed to the ceramic green sheet at the time of burying the toner particles 10. Accordingly, the holding force of the toner particles 10 in the photosensitive member 30x can be lowered in comparison with Example 1.

Example 4

Example 4 will be described now with reference to FIG. 6.

Figure 6:
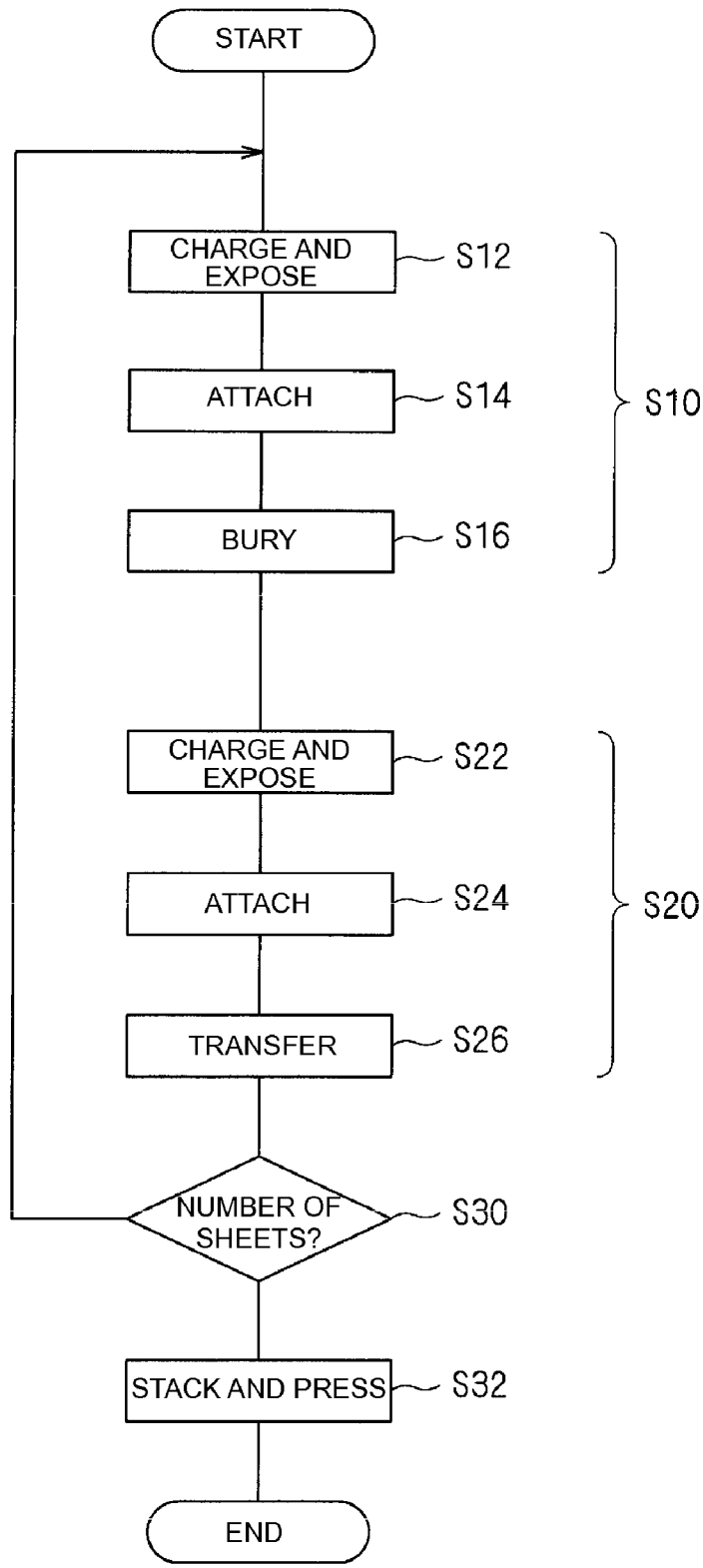
FIG. 6 is a flowchart illustrating a process of manufacturing a ceramic multilayered board (Example 4)

In Example 4, as shown in the flowchart of FIG. 6, similarly to Example 1, the via holes are formed in the ceramic green sheet (S10) and interconnection electrodes are formed on the ceramic green sheet with the toner for interconnection electrode using the electrophotographic printing method (S20).

Specifically, similarly to Example 1, the photosensitive member is charged and exposed to correspond to the positions of the ceramic green sheet at which the via holes should be formed to form a latent image pattern on the surface of the photosensitive member (S12). Subsequently, the planar portions of the toner particles are attached to the surface of the photosensitive member so that the tips of the protruding portions are directed to the outside (S14). Then, the toner particles are buried in the ceramic green sheet by thrusting the protruding portions of the toner particles attached to the surface of the photosensitive member in the top surface of the ceramic green sheet while pressing the photosensitive member against the ceramic green sheet. The top surface of the ceramic green sheet in which the toner particles are buried is flat.

Subsequently, unlike Example 1, the latent image pattern corresponding to the desired interconnection electrodes is formed on the photosensitive member for the interconnection electrodes (S22) by charging and exposing the photosensitive member for the interconnection electrodes and the toner image for the interconnection electrodes is formed by attaching the toner particles for the interconnection electrodes to the latent image pattern (S24). Then, the toner particles for the interconnection electrodes on the photosensitive member for the interconnection electrodes are caused to be close to the top surface of the ceramic green sheet and the toner particles are transferred and fixed to the top surface of the ceramic green sheet (S26).

The required number of ceramic green sheets is formed (S30) by repeating the above-mentioned steps, the required number of ceramic green sheets is laminated and pressed to form a laminated structure, and the laminated structure is plastically deformed to obtain the ceramic multilayered board (S32).

In Example 4, since the formation of the via holes and the formation of the interconnection electrodes can be successively carried out with the use of the same type of apparatus, it is possible to accomplish a reduction in manufacturing time and simplification of the processes. The interconnected electrode forming step (S20) may be performed before the via hole forming step (S10), or the via hole forming step (S10) and the interconnected electrode forming step (S20) may be simultaneously performed in parallel. The conductive material of the toner for the interconnection electrodes may be the same as the conductive material of the toner for the via holes. The same photosensitive member may be used in the via hole forming step (S10) and the interconnected electrode forming step (S20). The interconnection electrodes may be formed on the bottom surface of the ceramic green sheet.

Other Examples

As described above, when the green sheets in which the toner particles are buried using the electrophotographic printing method are laminated to manufacture a multilayered board, it is possible to reduce the processes for forming the via holes and thus to improve the yield.

The present invention is not limited to the above-mentioned preferred embodiments, but may be modified in various forms.

For example, the via holes may be formed by burying the toner particles in a green sheet containing an insulating material other than a ceramic, such as a B-stage resin. The present invention may be applied to a non-contractible board formed using a contraction suppressing layer for suppressing the contraction of the green sheet in the in-plane direction.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A via hole forming method using an electrophotographic printing method, comprising:
   a first step of forming a toner image by attaching toner particles, which contain a conductive material and have a protruding portion, onto a surface of a first photosensitive member so that the protruding portion is directed to an outside thereof; and
   a second step of opposing the surface of the photosensitive member to one principal surface of a green sheet containing an insulating material and transferring the toner image to the one principal surface of the green sheet so that the protruding portions of the toner particles protrude into the green sheet so as to reach the other principal surface of the green sheet and the toner particles are buried in the green sheet.

2. The via hole forming method according to claim 1, wherein the toner particles have a planar portion.

3. The via hole forming method according to claim 2, wherein a tip of the protruding portion of the respective toner particles is directed to a normal direction of the planar portion.

4. The via hole forming method according to claim 1, wherein a greater portion of each of the toner particles is formed of a single metal lump.

5. The via hole forming method according to claim 4, wherein the toner particles are formed by plating.

6. The via hole forming method according to claim 1, wherein the toner particles are formed by coupling a plurality of particles of a conductive material.

7. The via hole forming method according to claim 6, wherein the toner particles contain inorganic composite.

8. The via hole forming method according to claim 1, further comprising:
   a third step of forming a second toner image by attaching second toner particles containing a second conductive material to the surface of a second photosensitive member; and
   a fourth step of transferring the second toner image to the green sheet and transferring and fixing the second toner particles to the green sheet.

* * * * *